United States Patent [19]

Rockett, Jr.

[11] 4,369,378
[45] Jan. 18, 1983

[54] QUANTIZING CIRCUITS USING A CHARGE COUPLED DEVICE WITH A FEEDBACK CHANNEL

[75] Inventor: Leonard R. Rockett, Jr., Cranbury, N.J.

[73] Assignee: RCA Corporation, New York, N.Y.

[21] Appl. No.: 201,191

[22] Filed: Oct. 27, 1980

Related U.S. Application Data

[62] Division of Ser. No. 30,513, Apr. 16, 1979, Pat. No. 4,280,191.

[51] Int. Cl.³ .............. G11C 19/28; H01L 29/78; H03K 13/03
[52] U.S. Cl. .............. 307/221 D; 357/24; 340/347 AD
[58] Field of Search .............. 357/24 R, 24 M; 307/221 D

[56] References Cited

U.S. PATENT DOCUMENTS

| | | | |
|---|---|---|---|
| 4,259,597 | 3/1981 | Tiemann | 307/221 D |
| 4,270,144 | 5/1981 | Hartman et al. | 307/221 D |
| 4,283,696 | 8/1981 | Goser | 307/221 D |
| 4,306,221 | 12/1981 | Jiang et al. | 307/221 D |

Primary Examiner—Gene M. Munson
Attorney, Agent, or Firm—Samuel Cohen; George J. Seligsohn; Allen L. Limberg

[57] ABSTRACT

A signal to be quantized is translated to a charge Q and the latter is multiplied by a fraction f to produce a fractional charge packet fQ. Then, another fractional charge packet is produced by multiplying the remainder $Q(1-f)$ of the charge packet by f. This last step is repeated for succeeding remainder charge packets a sufficient number of times until a total of $n-1$ fractional charge packets have been produced, where n is the number of quantization levels desired. The successive fractional charge packets are compared with threshold levels of different amplitudes to determine the number of incremental charge packets, each of the same size, to be added to one another to form a quantized charge packet.

5 Claims, 9 Drawing Figures

QUANTIZING CIRCUITS USING A CHARGE COUPLED DEVICE WITH A FEEDBACK CHANNEL

This is a division, of application Ser. No. 030,513, filed Apr. 16, 1979, now U.S. Pat. No. 4,280,191.

The present invention relates generally to quantizing circuits and particularly to charge-transfer quantizing circuits.

There are many applications for quantizing circuits. As examples, they can be employed in analog-to-digital conversion systems, in charge multiplication systems and in sense-refresh circuits for digital memories employing multi-level storage, that is, in which storage of a parameter, such as charge, may be at more than two different levels.

In a system embodying the invention, a quantity indicative of a fraction of an input signal is produced and it is compared with a threshold level. The same fraction of the remainder of the input signal is then compared with a second threshold level. This process is performed a total of n−1 times, where n is the number of quantizing levels, for successively smaller parts of the input signal and successively different threshold levels, the latter being functions of the value of the fraction and of the particular signals being compared. Each time a comparison is made, an incremental quantity is produced only if the fractional part being compared to the threshold level is greater than the threshold level. The incremental quantities are added to one another to obtain the quantized quantity. In a preferred form of the invention, the system is implemented with charge transfer devices such as those of the charge-coupled device (CCD) type.

Figure 1:
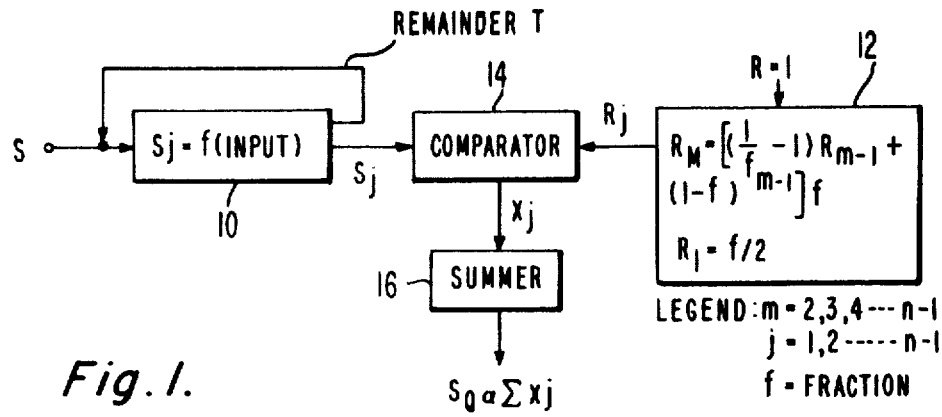
FIG. 1 is a block diagram of a generalized system embodying the invention.

The system shown in FIG. 1 includes a circuit 10 for multiplying the signal it receives by a fraction f. The first signal it receives is S and the first output signal it produces is $S_j$, where $j=1$ and $S_1=fS$. Thereafter the circuit 10 receives successive feedback remainder signals T. The first remainder signal $T_1$ is $(1-f)S$ and the output circuit 10 produces is $S_2=fS(1-f)$. The next remainder signal $T_2$ it receives is $S(1-f)(1-f)=S(1-f)^2$ so that the third output produced by circuit 10 is $S_j=S_3=fS(1-f)^2$.

The process above is performed a total of n−1 times where the total number of quantization levels desired is n. Thus, if n is a number such as 10, nine quantities $S_1$, $S_2$ ... $S_9$ are obtained with 0 being the tenth quantization level.

The circuit 12 in FIG. 1 is one for deriving from a reference quantity R, an output $R_j$ which has the value described by the following equations. Equation (1) describes a total of n−2 quantities and equation (2) a single quantity to provide a total of n−1 values of R.

$$R_m = \left[ \left( \frac{1}{f} - 1 \right) R_{m-1} + (1 - f)^{m-1} \right] f \quad (1)$$

(for $(m = 2, 3, 4 \ldots n - 1)$)

and $$R_1 = \frac{f}{2} \quad (2)$$

If the input reference level R initially is unity (1), then $R_1$, which is produced concurrently with $S_1$, has the value f/2, where f is the same fraction as employed in block 10. $R_2$, which is produced concurrently with $S_2$, has a value which can be calculated from equation (1). $R_3$ is produced concurrently with $S_3$ and its value also can be calculated from equation (1). All of this will be made clearer in the discussion below by reference to a specific example.

The comparator 14 compares the value of $S_j$ with $R_j$ and produces an output $X_j$. This output is applied to the summer 16. The value $X_j$ represents a 1, that is, one incremental quantity, when $S_j \geq R_j$ and $X_j$ represents a 0 when $S_j < R_j$. The summer 16, in response to the successive quantities $X_j$ it receives, produces a quantized output $S_Q$ proportional to the sum of all of the $X_j$'s. The summer can include amplification means so that its output $S_Q$ can be of larger value than the input quantity S.

To better illustrate how the system of FIG. 1 works, assume that the system is designed to be a 10-level quantizer and assume also that the quantity S represents 7.7 units. The quantizer must translate these 7.7 units into an output signal at a level representing eight output units. Assume also that the fraction $f=\frac{1}{4}$.

To operate the system, there must be nine passes through the circuit 10. During the first pass, the output signal $S_j$ will be $0.25 \times 7.7 = 1.93$. The remainder is $7.7 - 1.93 = 5.77$. During the second pass, the circuit 10 produces an output $5.77 \times 0.25 = 1.44$. These values and the various succeeding values are all given in Table I below.

TABLE I

| Pass | $S_j$ Signal Level |
|---|---|
| 1 | 0.25 × 7.7 = 1.93 |
| 2 | 0.1875 × 7.7 = 1.44 |
| 3 | 0.1406 × 7.7 = 1.08 |
| 4 | 0.1055 × 7.7 = 0.81 |
| 5 | 0.0791 × 7.7 = 0.61 |
| 6 | 0.0593 × 7.7 = 0.46 |
| 7 | 0.0445 × 7.7 = 0.34 |
| 8 | 0.0334 × 7.7 = 0.26 |
| 9 | 0.0250 × 7.7 = 0.19 |

Concurrently with the generation of the quantities shown in Table I, the circuit 12 will generate the threshold values $R_j$. The successive values of the threshold levels can be calculated using equations (1) and (2) and are shown in Table II below. The fraction f is the same as employed in block 10, namely $\frac{1}{4}$. Note that $R_1$ to $R_4$ are of successively increasing values and $R_4$ to $R_9$ are of successively decreasing values.

TABLE II $R_1 = 0.1250$
$R_2 = 0.2813 = [3(0.125) + (.75)] \, 0.25$
$R_3 = 0.3515 = [3(0.2813) + (.75)^2] \, 0.25$
$R_4 = 0.3693 = [3(0.3513) + (.75)^3] \, 0.25$
$R_5 = 0.3560 = [3(0.3693) + (.75)^4] \, 0.25$
$R_6 = 0.3262 = [3(0.3560) + (.75)^5] \, 0.25$
$R_7 = 0.2893 = [3(0.3262) + (.75)^6] \, 0.25$
$R_8 = 0.2505 = [3(0.2893) + (.75)^7] \, 0.25$
$R_9 = 0.2125 = [3(0.2505) + (.75)^8] \, 0.25$

Figure 5:
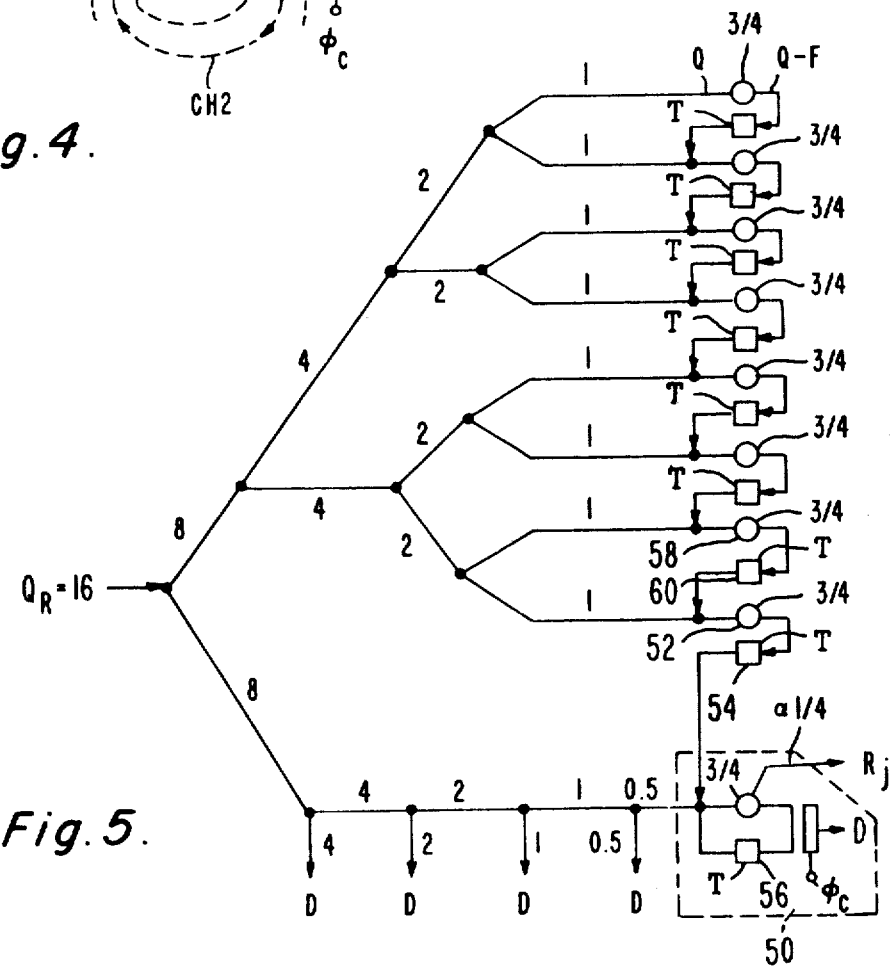
FIG. 5 is a schematic showing of a CCD recirculating reference signal register such as may be employed in FIG. 2.

A circuit for realizing the operation summarized in this table is illustrated in FIG. 5 which is discussed later.

By comparing Table I with Table II, it will be seen that the signal level is greater than the reference level during the first eight passes and is smaller than the reference level during the ninth pass. Therefore, comparator 14 will produce an $X_j = 1$ output for values $j = 1, 2 \ldots 8$ and will produce an $X_j = 0$ output for $j = 9$. The summer 16 therefore will produce a quantized output $S_Q\alpha 8$.

Figure 2:
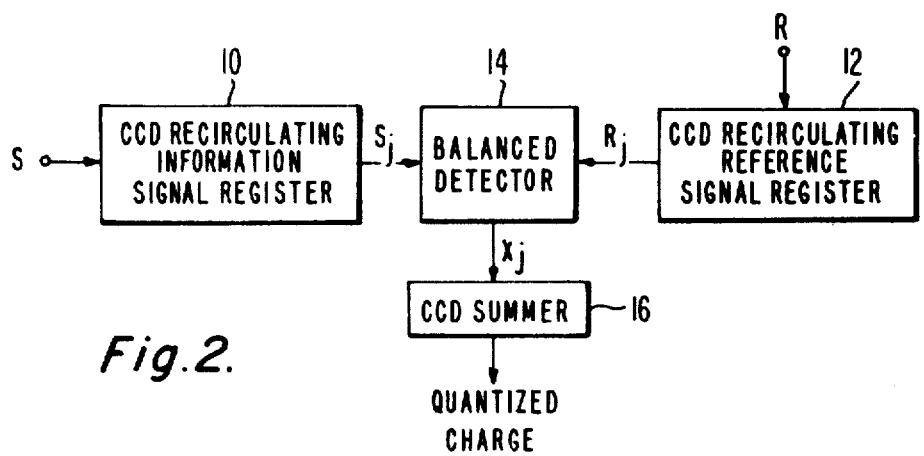
FIG. 2 is a block diagram of a CCD system embodying the invention.
Figure 8:
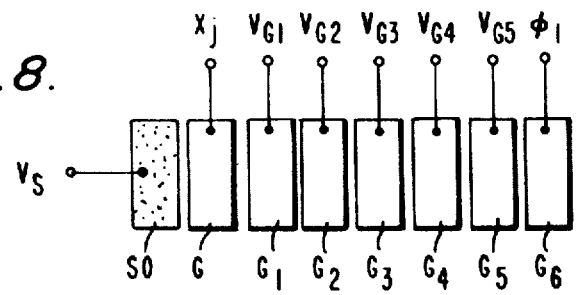
FIG. 8 is a schematic showing of a CCD summer which may be employed in the system of FIG. 2.

A charge-coupled device (CCD) implementation of FIG. 1 is illustrated in FIG. 2. S represents an input signal voltage which is translated to a charge. The circuit 10 comprises a CCD recirculating information signal register, the details of which are discussed shortly. R is a reference voltage at a fixed level and it is translated to a charge $Q_R$ which is supplied to the CCD recirculating reference signal register 12, the details of which are given in FIG. 5. The comparator 14 may be a balanced detector, for example of the same type as illustrated in FIG. 8 of U.S. Pat. No. 4,206,446 issued June 3, 1980 for "CCD A-to-D Converter," by the present inventor and assigned to the same assignee as the present patent. The inputs of the two nodes 132 and 130 of the balanced detector would correspond to the inputs $R_j$ and $S_j$ from the circuits 12 and 10 of the present system. An output is obtained from the circuit of a sense to produce a potential valley when $S_j \geq R_j$ and a potential barrier when $R_j > S_j$. With the assumption that the CCD's employed will be surface channel, N-channel, that is, P-type substrates CCD's, a voltage applied to a gate electrode for producing a potential valley in the substrate is relatively positive and one for producing a potential barrier is relatively less positive and, for example, may be close to ground potential.

Figure 3:
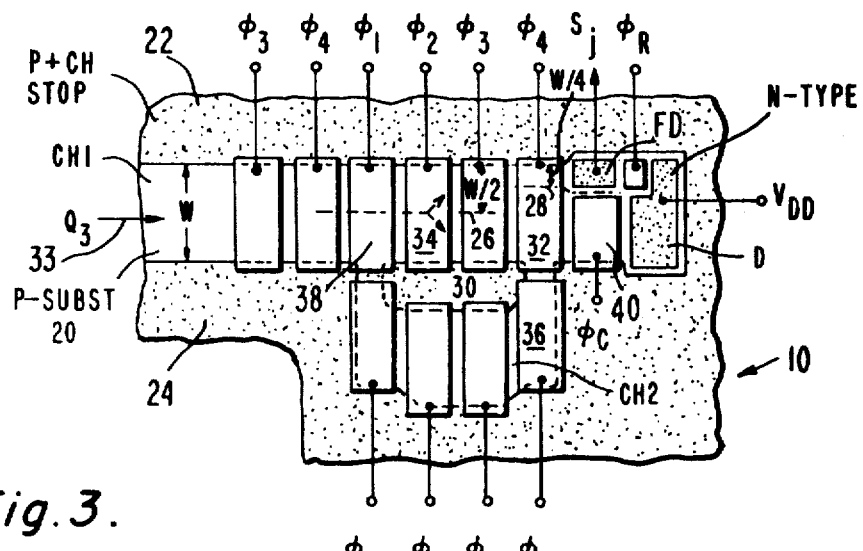
FIG. 3 is a plan view of a CCD circulation information signal register such as may be employed in FIG. 2.

FIG. 3 illustrates the recirculating information signal register 10 of FIG. 2. It comprises a semiconductor substrate 20 assumed to be of P-type silicon and a plurality of gate electrodes insulated from the substrate. A channel CH1 in the substrate is defined by channel stop regions 22, 24 which may be P+ regions of the substrate, that is, regions doped more heavily than the channel region. The heavy dashed lines 26 and 28 represent narrow channel stop regions beneath electrodes 30 and 32, respectively, and these subdivide the channel beneath the electrodes. The region 26 subdivides the channel into equal parts. In the present example where W remains constant throughout the length of the channel, the channel width above 26 is W/2 and below 26 is W/2. In similar fashion, the channel stop 28 is for the purpose of dividing the charge flowing from beneath the upper part of the electrode 26 in half. Again, in this example, this is accomplished by having the channel stop 28 divide the channel region into parts W/4 and 3W/4, as shown. For purpose of this discussion, and for the illustration, the widths of the channel stops 26 and 28 (and the analogous ones shown later) are ignored. The register includes a feedback channel CH2 over which a portion of the charge is propagated back to the input part of the loop for further fractionalization.

In the operation of the CCD of FIG. 3, the input charge $Q_S$ at a level proportional to the signal it is desired to quantize is propagated in the direction of arrow 33 by multiple-phase voltages applied to electrodes (only some of which are shown) over the channel. At a time corresponding to the phase 2 voltage $\phi_2$, the charge $Q_S$ is present beneath electrode 34. When the $\phi_3$ voltage occurs and the $\phi_2$ voltage terminates, this charge is split into two equal parts, one part propagating to the substrate region beneath the upper half (as viewed in the drawing) of electrode 30 and the other half to the substrate region beneath the lower half of electrode 30. When $\phi_4$ occurs and $\phi_3$ is removed, the charge packet beneath the upper part of the electrode 30 is divided in half again with $\frac{1}{4}$ propagating to the portion of the substrate above channel stop 28 and the other quarter propagating to the region of the substrate below channel stop 28. This quarter charge packet combines with the half charge packet propagated from beneath the lower portion of electrode 30 and forms a charge packet which is $\frac{3}{4}$ of the size of the charge packet $Q_S$. Thus, beneath electrode 32 there are now two charge packets, one above channel stop 28 of an amplitude $Q_S/4$ and the other below channel stop 28 and of an amplitude $3Q_S/4$. Here and in the following discussion the terms "above" and "below" refer to the position of the charges as viewed in the plan view of FIG. 3. The charge packet $Q_S/4$ propagates to the N-type floating diffusion FD in the substrate and an output voltage $S_j$ is produced which is proportional to $Q_S/4$.

The voltage $S_j$ is compared with $R_j$ in the balanced detector 14 of FIG. 2 and upon completion of the comparison, the reset voltage $\phi_R$ occurs to reset the floating diffusion FD to a reference level, that is, to one close in value to $V_{DD}$, the voltage at which the N-type drain region D in the substrate is maintained. (In practice, the drain D and the reset electrode to which $\phi_R$ is applied may be common to the balanced detector circuit 14.) At this time the voltage $\phi_C$ is relatively negative creating a potential barrier between the $\phi_4$ electrode 32 and the drain D.

The charge $3Q_S/4$ beneath electrode 32 subsequently propagates to beneath the $\phi_1$ electrode 36, this occurring when $\phi_4$ goes low and $\phi_1$ goes high. The remaining multiple-phase voltages subsequently propagate this charge packet $3Q_S/4$ through the loop so that when $\phi_4$ goes from high to low while $\phi_1$ goes high, the $3Q_S/4$ charge packet becomes stored in the substrate region beneath $\phi_1$ electrode 38. The process described for $Q_S$ is now repeated; however, the input charge is $\frac{3}{4}Q_S$.

What has been described above is one complete pass through the recirculating information signal register and the start of the second pass through this register. The number of passes required through the register 10 is equal to n−1, where n is the number of quantization levels. In the example previously discussed, n=10. The register illustrated in FIG. 3 is one suitable for this example when $f=\frac{1}{4}$. Upon completion of the nine passes through the register, there will still be some residual charge in the register and this should be cleared out before the next incoming signal is quantized. This may be done by making the clear voltage $\phi_C$ high to create a conduction channel beneath electrode 40. When the voltage $\phi_4$ occurs after the ninth pass, this residual charge passes to the drain D via the conduction channel beneath electrode 40 and now the register is available for processing the next signal charge $Q_S$.

Figure 4:
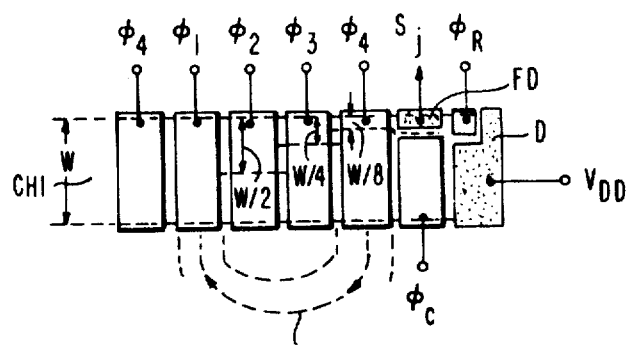
FIG. 4 is a schematic showing of a second form of information signal register.

For purposes of initial explanation, the fraction f was stated to be ¼. However, the actual value chosen will depend upon the engineering design. FIG. 4 illustrates a recirculating information signal register in which the fraction is f = ⅛. The operation of this register is believed to be self-evident from the discussion of FIG. 3. It, of course, will be appreciated that the two examples given are just that, namely, merely examples, as other registers could be designed for other fractions such as ½ or any other fraction $k/2^t$ where k = 1 to $2^t$, and t is an integer. The fraction desired can be realized by successive divisions of charge by two, by appropriate placement of the channel stop regions beneath the electrodes, in each case, to divide the charge arriving at an electrode by two.

FIG. 5 illustrates a CCD which implements block 12 of FIG. 2. The solid lines in FIG. 5 represent CCD channels including the substrate and the electrodes for propagating charge along the channels. Two lines diverging from a single line represent a charge splitting stage and this can be implemented simply by employing two divergent CCD channels with a common electrode at the input of the two channels. Such charge splitting is well known in the art. In each of the charge splitting stages illustrated, the incoming charge is divided in half implying divergent channels of equal width.

A circle in FIG. 5 represents a factoring stage, that is, one for passing a fraction of the charge it receives, the fraction in this example, being ¾. In general, it can be shown that if f is the fraction employed in circuit 10, then the factoring stages in FIG. 5 must pass a fraction of the charge they receive equal to 1−f. A square in FIG. 5 represents a CCD delay line which insert a delay $\tau$. $\tau$, in this instance, is the delay through one stage of the CCD, where one stage includes four electrodes in the example illustrated of a 4-phase CCD. The circuit shown within the dashed block 50 is a recirculating register similar to what already has been discussed. For the particular example 50 in which f=¼, the register would be similar to that of FIG. 3, the output $R_j$ being substituted for $S_j$. The letter D in FIG. 5 represents a drain for disposing of charge in the channel.

In the operation of the circuit of FIG. 5, sixteen units of charge, that is $Q_{R=16}$ are introduced at the input. This charge is subdivided in the way illustrated so that 0.5 units of the charge eventually reach the circuit 50. In response to the multiple phase voltages, the first threshold level is 0.125 as required by Table II. After the first pass through circuit 50, circuit 50 receives an additional charge packet which initially passed through factoring stage 52 where it lost one quarter of its charge and was then delayed by delay means 54. This packet of charge adds to the delayed fraction of the charge (0.5−0.125) arriving from delay means 56 and one quarter of the sum of the two is produced at $R_j$. This output $R_j = R_2 = 0.25(0.5 − 0.125 + 0.75) = 0.2813$ which agrees with Table II.

The process is repeated a third time; however, this time the input to 50 consists of the delayed ¾ charge packet coming from 58 and which has passed through the delay line 60. This ¾ charge was again factored at 52 to produce a (¾)² charge, and was further delayed at 54.

By the start of the third pass, the (¾)² charge is present at the input to 50. Here it adds to the remainder charge (0.2813)(3) delayed by 56. The fraction of the sum charge then becomes available as $R_j = R_3$ and is equal to 0.3513 as indicated in Table II above. These steps are continued for nine passes and the various threshold levels produced are as shown in Table III below.

TABLE III

| Pass | Threshold Level |
|------|-----------------|
| 1 | 0.25 × 0.5 = 0.125 |
| 2 | 0.1875 × 1.5 = 0.2813 |
| 3 | 0.1406 × 2.5 = 0.3515 |
| 4 | 0.1055 × 3.5 = 0.3693 |
| 5 | 0.0791 × 4.5 = 0.3560 |
| 6 | 0.0593 × 5.5 = 0.3262 |
| 7 | 0.0445 × 6.5 = 0.2893 |
| 8 | 0.0334 × 7.5 = 0.2505 |
| 9 | 0.0250 × 8.5 = 0.2125 |

Figure 6:
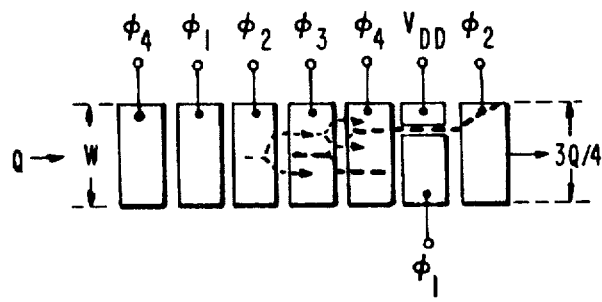
FIG. 6 is a schematic showing of a factoring stage which may be employed in the system of FIG. 5.
Figure 7:
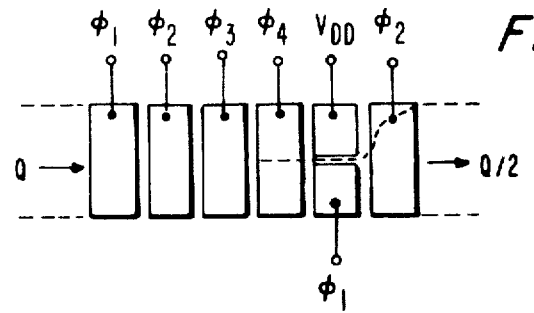
FIG. 7 is a schematic showing of another form of factoring stage which can be used in an alternative form of FIG. 5.

In the particular example just discussed, the factoring stage is one for producing an output charge packet which is ¾ the amplitude of an input charge packet and its structure is shown in FIG. 6. This, of course, is only one example. FIG. 7 illustrates a second example in which the fraction is ½. It should be self-evident from these examples how stages passing other fractions could be constructed.

Figure 9:
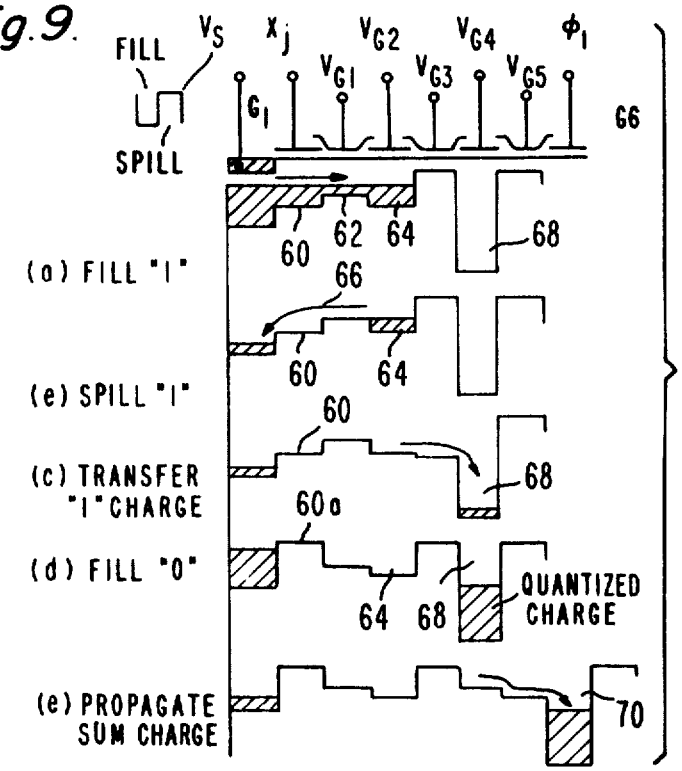
FIG. 9 is a schematic cross-sectional showing of FIG. 8 and illustrates also surface potential profiles present during the operation of this summer.

The CCD summer 16 of FIG. 2 may be a fill and spill circuit such as illustrated in FIGS. 8 and 9. This CCD includes an input region SO in the substrate which in the case assumed of a P substrate channel region, would be of N conductivity type. This region operates as a source of charge carriers (electrons) during the fill portion of the cycle and as a drain for these charge carriers during the spill portion of the cycle. The first electrode G is one whose potential is controlled by $X_j$, the output of the comparator. The following electrode $G_1$ is maintained at a DC level $V_{G1}$ and the following electrode $G_2$ is maintained at a more positive level $V_{G2}$. The following electrode $G_3$ is maintained at a relatively less positive potential during the fill and spill portion of the cycle and then is placed at a more positive level to effect the transfer of charge into the following potential well 68. Electrode $G_4$ is a storage electrode and it produces a deep potential well 68 in which the successive incremental charge packets produced in response to successive samples $X_j$ are stored. Electrode $G_5$ produces a potential barrier to prevent the charge stored in the potential well beneath electrode $G_4$ from passing down the channel. The final electrode shown, $G_6$ and the following ones (not illustrated), are electrodes to which multiple-phase voltages are applied for propagating the quantized charge.

The operation may be followed by considering FIG. 9. Assume to start with that $X_j = 1$, that is $S_j > R_j$. When $X_j$ is a 1, the voltage level produced at $X_j$ is relatively positive and a potential valley 60 is produced at the substrate surface beneath electrode G. $V_S$, the voltage applied to region SO, first is made relatively negative so that region SO acts as a source of electrons. These electrons pass through the valley 60 and over the potential barrier 62 and fill the potential well 64 beneath electrode $G_2$. All of this is illustrated at a in FIG. 9.

The voltage $V_S$ applied to region SO now goes relatively positive and the region SO therefore acts as a drain for electrons. The excess electrons spill out of well 64 as indicated by arrow 66 and these excess electrons return to region SO all as shown at b in FIG. 9.

The charge packet remaining in well 64 is an incremental charge packet. Its size is a function of the difference in potential between $V_{G2}$ and $V_{G1}$. If $V_{G2}$ is made more positive, for example, and $V_{G1}$ is maintained of the same value, the incremental charge packet 64 will be of larger size. Thus, the unit charge increment can be made any practical size desired so as to produce the relationship desired between the amplitude of the quantized signal $S_Q$ of FIG. 1 and that of the input signal S. For example, if the incremental charge packets are made relatively large, the output quantized signal can be substantially larger than the input signal and vice versa.

After the step b above, the incremental charge packet in well 64 is transferred to storage well 68 by making voltage level $V_{G3}$ more positive as illustrated at c in FIG. 9.

The process described above is illustrated at a, b and c in FIG. 9, is repeated for successive samples of $X_j$, that is, for $X_1$, $X_2$, $X_3$ and so on. Each time $X_j=1$, an incremental charge packet is produced and is shifted into storage well 68 where it combines with previous incremental charge packets which have been stored there. In the example previously discussed, nine samples are taken and when S=7.7, as assumed, for the first eight samples $X_1 \ldots X_8$, $X_j=1$. FIG. 9d illustrates the case for the ninth sample in which $X_j=0$. When $X_j=0$, the voltage $X_j$ becomes less positive and the surface potential 60a beneath electrode G increases so that a potential barrier is present beneath electrode G. Now during the fill process as illustrated at d, the electrons produced at the input region SO can not pass over the barrier 60a so that no charge passes into well 64. Accordingly, during the transfer step illustrated at c in FIG. 9, since no charge is present in well 64, no charge passes into the storage well 68.

After all of the samples $X_j$ have been taken, that is, after the ninth pass in the example discussed, the quantized charge packet is propagated down the output register of the summer 16. The first step in the propagation is illustrated at e in FIG. 9. During this step $V_{G4}$ becomes relatively less positive while $V_{G5}$ becomes more positive and $\phi_1$ becomes more positive still. The surface potential profile then changes to that shown at e in FIG. 9 and the quantized charge formerly present in well 68 shifts to the potential well 70 beneath the $\phi_1$ electrode $G_6$. This charge subsequently is propagated down the output register in response to the multiple phase voltages $\phi_1$, $\phi_4$.

While the invention has been illustrated in terms of a surface channel, N-channel CCD, it is to be understood that this is an example only. The invention is equally applicable to surface channel, P-channel CCD's and to buried channel devices of various types. Further, the electrodes illustrated schematically may be of any desired type such as single layer, double layer, triple layer, etc., and may be formed of metal, polysilicon or other well-known materials. Further, while in the various embodiments illustrated, the outputs are taken from floating diffusions which are believed to be preferred in view of their sensitivity, one could instead use floating gates or other output structures.

What is claimed is:

1. A charge-coupled device (CCD) for translating a signal charge to fractional charge packets comprising, in combination:
    a main CCD channel along which a signal charge is propagated;
    means in said main channel for dividing said signal charge into a fractional charge packet and a remainder charge packet;
    means responsive to any fractional charge packet present in said main CCD channel for producing an output signal of an amplitude proportional thereto; and
    a feedback CCD channel receptive of any remainder charge packet present in said main CCD channel for propagating the same back to said main CCD channel for division of said remainder charge packet in the same manner as the division of said signal charge.

2. A CCD as set forth in claim 1 wherein said means for dividing comprises means for dividing the signal charge into two equal halves.

3. A CCD as set forth in claim 2 wherein said means for dividing comprises means for performing successive divisions by two of a charge.

4. A CCD as set forth in claim 1, further including:
    means for removing any charge remaining in said main CCD channel after N passes of charge through said feedback CCD channel, where N is an integer.

5. A CCD as set forth in claim 1, wherein said fractional charge packets and the output signals derived therefrom are successively produced, and further including:
    means for producing successive threshold levels concurrently with said successively produced output signals, respectively, the value of each threshold level being a function of the value of said fraction and of the order in which that threshold level is produced;
    means for comparing each output signal with the concurrently produced threshold level to produce, in each case, an output of one value when the output signal is greater than the threshold level and an output of a second value when the output signal is smaller than the threshold level; and
    means for adding to one another said outputs of said means for comparing.

* * * * *